United States Patent [19]

Collins et al.

[11] Patent Number: 4,801,839
[45] Date of Patent: Jan. 31, 1989

[54] MOUNTING OF A COLD CATHODE DIRECTLY TO A VACUUM CHAMBER WALL

[75] Inventors: George J. Collins, Fort Collins, Colo.; Jack D. Meyer, Rio Rancho, N. Mex.; Zeng-qi Yu, Ft. Collins, Colo.

[73] Assignee: Applied Electron Corporation, Albuquerque, N. Mex.

[21] Appl. No.: 939,054

[22] Filed: Dec. 8, 1986

[51] Int. Cl.[4] .............. H01J 1/96; H01J 7/26; H01J 17/38; H01J 3/097
[52] U.S. Cl. ..................... 313/30; 313/268; 313/618; 313/619; 372/87
[58] Field of Search ............ 313/30, 32, 632, 619, 313/618, 247, 257, 292, 268; 372/74, 85, 87, 88

[56] References Cited

U.S. PATENT DOCUMENTS

| 3,430,091 | 2/1969 | Davis | 313/619 X |
| 3,758,806 | 9/1973 | Bostrom | 313/268 |
| 4,196,938 | 4/1980 | Lunev et al. | 313/32 |
| 4,317,067 | 2/1982 | Fitzsimmons et al. | 372/85 X |
| 4,595,377 | 6/1986 | Norvell | 313/346 R |

*Primary Examiner*—David K. Moore
*Assistant Examiner*—Sandra L. O'Shea
*Attorney, Agent, or Firm*—William E. Hein

[57] ABSTRACT

A cold cathode for generating an abnormal glow discharge electron beam within a vacuum chamber is mounted to a wall of the vacuum chamber such that only the emitting front face of the cold cathode, itself electrically insulated from the vacuum chamber wall by a narrow gap therebetween, is located inside the vacuum chamber, while the remainder of the cold cathode is located outside the vacuum chamber.

5 Claims, 3 Drawing Sheets

MOUNTING OF A COLD CATHODE DIRECTLY TO A VACUUM CHAMBER WALL

REFERENCE TO RELATED APPLICATION

This application is related to and incorporates by reference the subject matter of allowed U.S. patent application Ser. No. 656,408 entitled D.C. Electron Beam Method and Apparatus for Continuous Laser Excitation filed on Oct. 1, 1984 now U.S. Pat. No. 4,641,316, issued Feb. 3, 1987.

BACKGROUND OF THE INVENTION

Cold cathode abnormal glow gas discharge created electron beams have been used for pumping gas lasers, processing microelectronic films, and for soft vacuum lithography. The cold cathode can be constructed of a variety of materials, including metals such as aluminum, magnesium, molybdenum or stainless steel, metal-ceramic composites such as $Si\text{-}SiO_2$, $Al\text{-}Al_2O_3$, $Mo\text{-}Al_2O_3$, $Mo\text{-}MgO$, or metals with thin insulating or semi-insulating surface layers such as aluminum with an $Al_2O_3$ surface layer or silicon with an $SiO_2$ surface layer. Generally, the secondary electron emission coefficient, $v$, of the cathode material following ion and photon bombardment determines the cold cathode electron beam generation efficiency via the $v/(1+v)$ factor. Typically, metals have $v<1$ and ceramic composites have $v>1$. The cathode front surface exposed to the abnormal glow discharge may be of a variety of geometric shapes to electrostatically shape the electron beam emitted. Large area beam sources, focused line source beams, and spot beam sources are but three illustrative examples.

In the prior art relating to glow discharge created electron beams electron emission was purposely restricted to the cathode front face by employing a separate cathode shield to prevent electron emission from other cathode surfaces. Cathode shielding was necessary because the entire cathode was immersed in the abnormal glow discharge region located inside the vacuum chamber. In the absence of a shield the entire cathode is exposed to the abnormal glow gas discharge, resulting in electron emission from all exposed cold cathode surfaces. In this prior art shielded cathode configuration, water cooling of the cold cathode located inside the vacuum chamber always required complex mechanical and vacuum construction. For example, the size of the mechanical spacer between the cathode shield and the cold cathode itself is typically a fraction of a millimeter in thickness and must be of precise geometric construction. The typical tolerance is ±0.1 millimeter along the entire length of the cold cathode-to-cathode shield periphery. For high power operation of the cold cathode an internal cooling system must be included for exhausting heat created by ion bombardment of the cold cathode. Degradation of the cathode front face occurs due to ion bombardment erosion. For this reason, frequent cathode replacement or cathode front face cleaning must also be carried out in order to maintain the stability and uniformity of the abnormal glow discharge created electron beam.

In summary, the prior art cold cathode configurations which attempt to satisfy both electrical cathode shielding and internal thermal cooling are complex in mechanical design and construction, are costly, and exhibit low reliability.

SUMMARY OF THE INVENTION

In accordance with the present invention, a cold cathode is disclosed that employs the vacuum chamber walls rather than a separate cathode shield and direct mechanical and vacuum attachment of the cold cathode to the vacuum chamber walls. Only the cathode front face, itself electrically insulated from the vacuum chamber wall by a narrow gap located between the cold cathode and the wall of the vacuum chamber, is located inside the vacuum chamber. The remainder of the cold cathode is located external to the vacuum chamber. The choice of a gap dimension, $d$, between the cold cathode and the vacuum chamber wall is determined by the conventional Paschen discharge breakdown law. That is, for a given discharge breakdown voltage, the reactor pressure multiplied by the gap dimension $d$ is a constant for each gas or gas mixture and cathode material employed. The gap dimension $d$ must be small enough to prevent the electrical breakdown of the gas mixture for a given gas type, gas pressure, cathode material, and applied cathode voltage.

The cold cathode cooling system employed in the present invention is located outside the vacuum chamber. Cathode cooling can be accomplished by either conventional gaseous or liquid based thermal exchange systems, as well as by simple radiative cooling using fins. The cathode shield employed in the prior art is not required since none of the cathode surfaces, except the front face, is exposed to the abnormal glow discharge. Rather, these other surfaces are shielded by the vacuum chamber walls from ion and photon bombardment and hence cannot emit secondary electrons.

Cold cathode front face replacement or cathode cleaning is readily accomplished in the apparatus of the present invention because of the simple mechanical cathode assembly, the absence of the separate cathode shield required in conventional designs and the use of external cathode cooling. The ease with which cathode replacement is accomplished is a considerable practical advantage since frequent replacement or cleaning of the cathode front face is required in normal operation.

DESCRIPTION OF THE ILLUSTRATED EMBODIMENTS OF THE INVENTION

Figure 1:
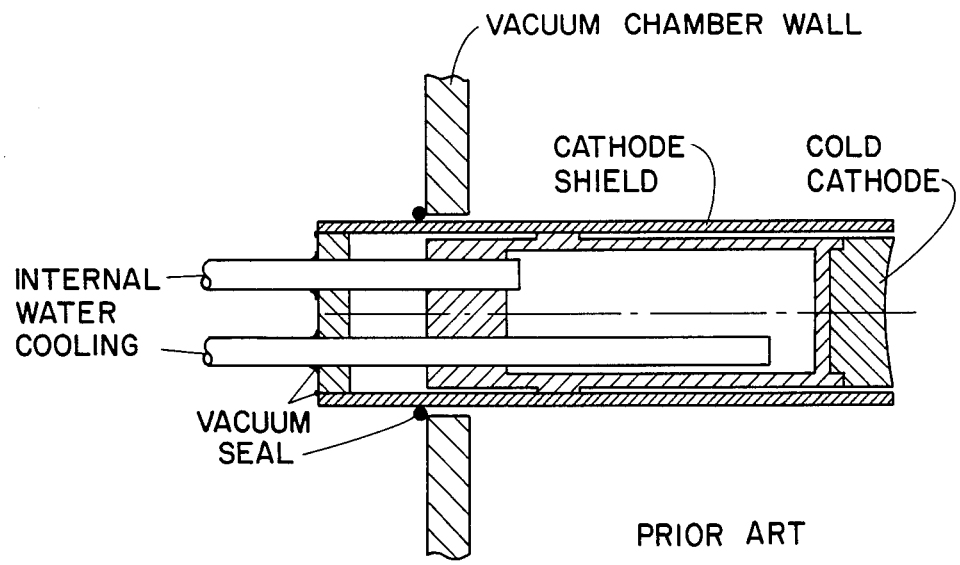
FIG. 1 is an illustration in corss section of a conventional cold cathode electron gun constructed according to the prior art.
Figure 2A:
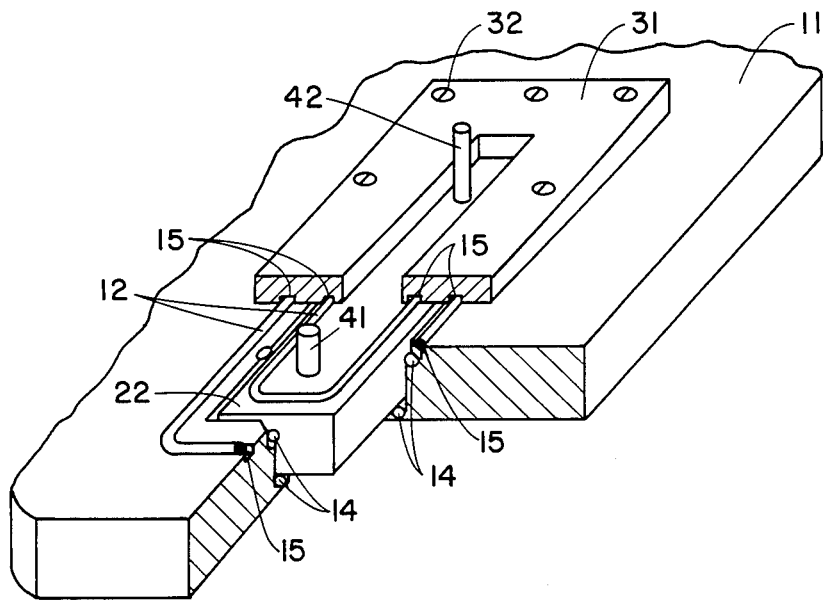
FIGS. 2A-D are illustrations in cross section of a cold cathode electron gun constructed in accordance with a preferred embodiment of the present invention.
Figure 2B:
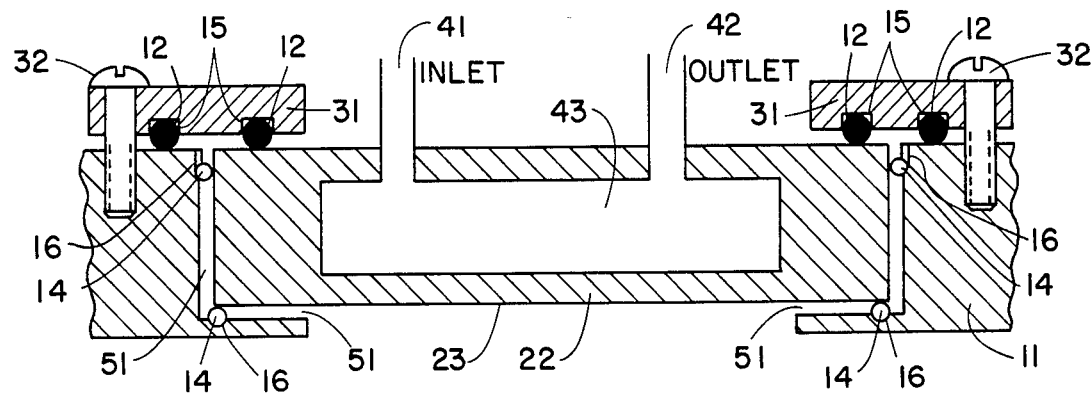
Figure 2C:
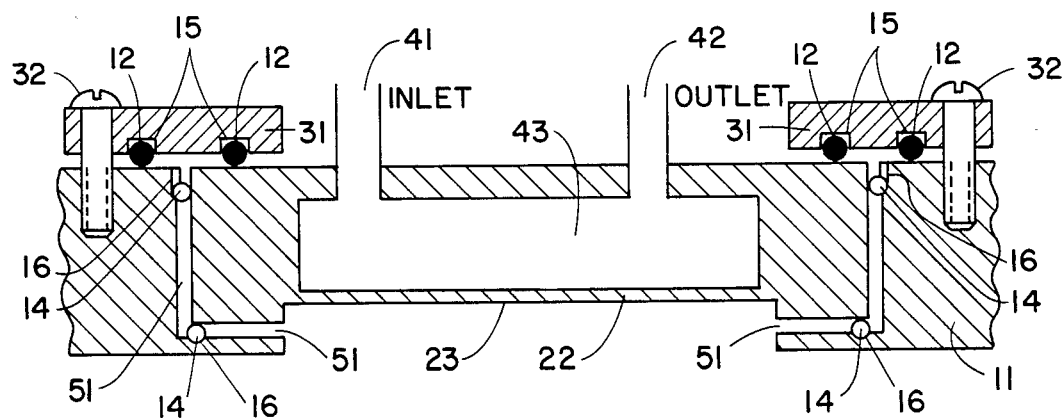
Figure 2D:
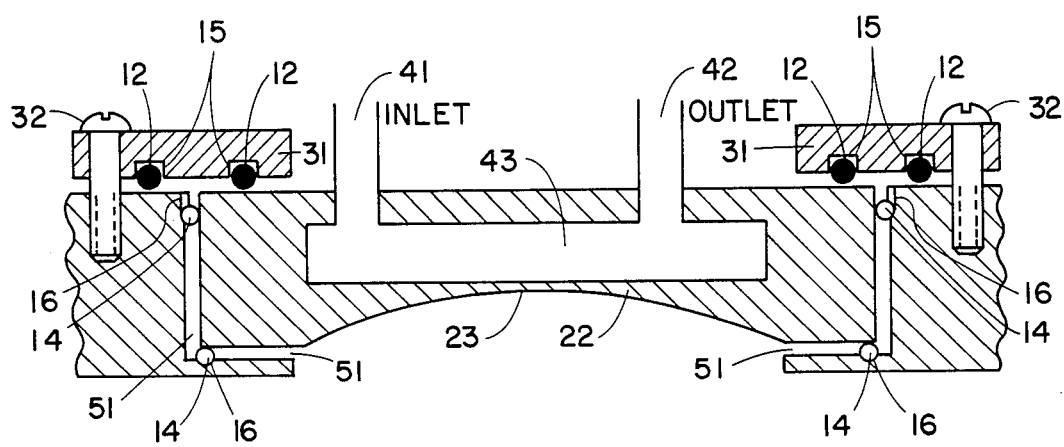
Figure 3:
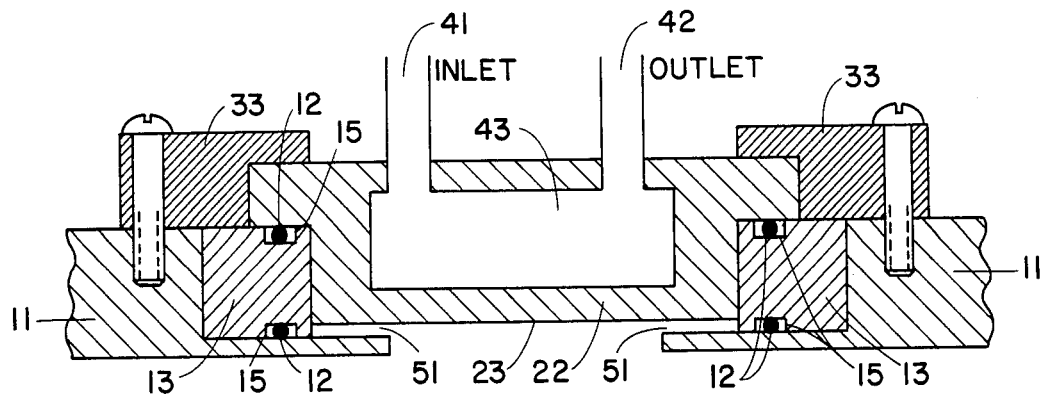
FIG. 3 is an illustration in cross section of the cold cathode electron gun of FIGS. 2A-D employing an alternative cathode-wall spacing and vacuum sealing technique.
Figure 4:
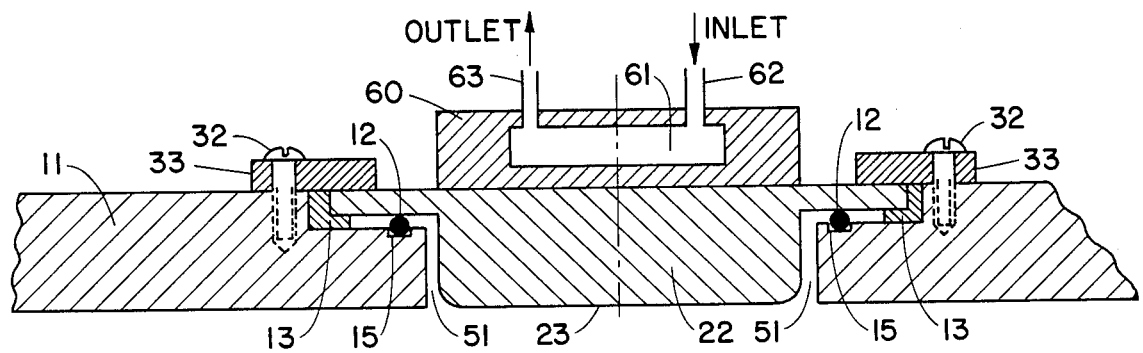
FIG. 4 is an illustration in cross section of the cold cathode electron gun of FIGS. 2A-D employing a Rogowski-shaped cathode front face contour and external cathode cooling.
Figure 5:
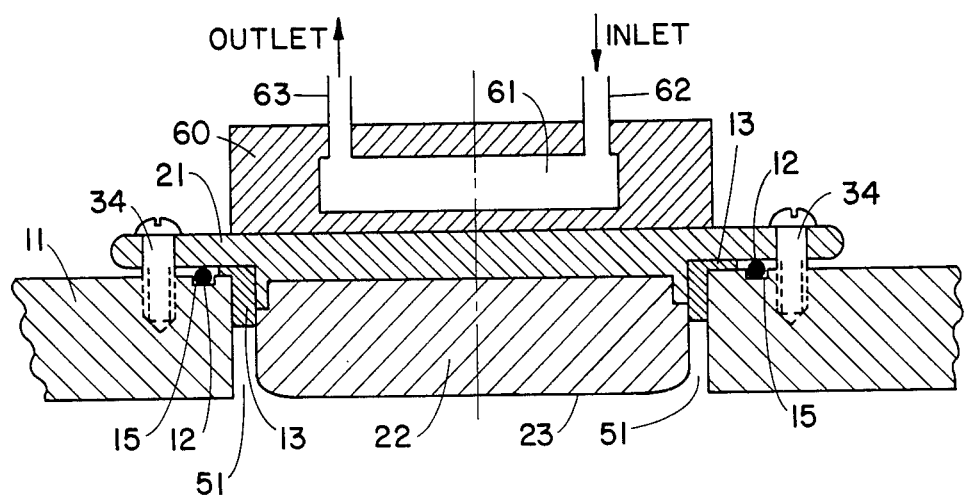
FIG. 5 is an illustration in cross section of an alternative embodiment of the cold cathode electron gun of FIGS. 2A-D employing a separate mechanical cathode mount, a separate insertable cathode front face, and external cooling attached to the cold cathode mount.

Referring now to FIGS. 2-5, there are shown in cross section four embodiments of the cold cathode mounting configuration of the present invention. The conventional cathode shield taught in the prior art apparatus of FIG. 1 is eliminated in accordance with the embodiments of the present invention illustrated in FIGS. 2-5 by employing a vacuum chamber wall 11 to shield all surfaces of a cold cathode 22 except a front face 23 thereof. The front face 23 of cold cathode 22 is constructed of a material having a high secondary electron emission coefficient, v, following ion or photon bombardment. For example, the cathode front face 23 may be made of metallic aluminum having a thin oxide layer on its surface, or a metal-ceramic material such as Mo-$Al_2O_3$ both of which have v values in excess of unity. The cathode front face 23 is mechanically attached to or is an integral part of the cold cathode 22. Cold cathode 22 is attached to the vacuum chamber wall 11 by means of an electrically insulating cathode fixture 31 and therefore may employ electrically conducting screws 32, as shown in FIGS. 2A-D. Cold cathode 22 is electrically insulated from the vacuum chamber wall 11 via an insulating gap 51 between the periphery of cold cathode 22 and the vacuum chamber wall 11, provided the Paschen discharge breakdown law is satisfied. A set of precision insulating ball bearings 14, as shown in FIGS. 2A-D, or electrically insulating spacers 13, as shown in FIGS. 3-5, are used to electrically insulate the cold cathode 22 from the vacuum chamber wall 11. Vacuum chamber wall 11 is typically fixed at ground potential for safety reasons. The insulating ball bearings 14, which reside in seats 16, as shown in FIG. 2A-D, or insulating spacers 13, as shown in FIGS. 3-5, serve to insure that insulating gap 51 will have a uniform selected width.

Two conventional "O" rings 12 are positioned in associated "O" ring grooves 15 in a cathode fixture 31 to provide a vacuum seal between the cathode fixture 31 and the cold cathode 22, as well as between the cathode fixture 31 and the vacuum chamber wall 11, as shown in FIGS. 2A-D. In FIG. 3, two conventional "O" rings 12 are positioned in "O" ring grooves 15 in the electrically insulating spacers 13 to provide a vacuum seal between the electrically insulating spacer 13, the vacuum chamber wall 11, and the cold cathode 22. Only one "O" ring 12 is employed in the cold cathode mounting configurations of FIGS. 4 and 5. In FIG. 4, the "O" ring 12 positioned in associated "O" ring groove 15 in vacuum chamber wall 11 provides a vacuum seal between the cold cathode 22 and the vacuum chamber wall 11. In FIG. 5, the "O" ring 12 positioned in associated "O" ring groove 15 in vacuum chamber wall 11 provides a vacuum seal between the vacuum chamber wall 11 and a cathode plate 21.

The only cathode surface in the present invention exposed to ion or photon bombardment from the abnormal glow discharge is the cathode front face 23 where secondary electrons are emitted following ion or photon bombardment. The cold cathode 22 and associated cathode front face 23 may be formed in a variety of geometric shapes, such as a circular disc, extended line, square, rectangle or other geometries, depending on the application. The curvature of the cathode front face 23 may be adjusted to create either a wide area electron beam or a focused electron beam, as described below. A flat cathode front face 23 is employed to create an unfocused large area electron beam. A Rogowski profile may replace the flat cathode front face 23, as shown in FIGS. 4 and 5, to improve the uniformity of wide area electron emission from the front face 23 of cold cathode 22 across its cross-section, especially at the edges. The cathode front face 23 may be slotted or may have a concave curvature for producing a focused electron beam from the abnormal glow discharge, as shown in FIGS. 2C and 2D, respectively. Point source or line shape focused beams are thereby possible, depending on the selected geometric shape of cold cathode 22.

The insulating cathode fixture 31 contains conventional "O" ring grooves 15, as illustrated in FIGS. 2A-D. Insulating cathode fixture 31 provides both vacuum sealing and mechanical support for cold cathode 22, as illustrated in FIGS. 2A-D. In the embodiments of the invention illustrated in FIGS. 3 and 4, the cathode fixture 33 is also constructed of an electrically insulating material, and only functions as a mechanical clamp for the cold cathode 22 and does not provide vacuum sealing. The vacuum seal is formed by the "O" rings 12 and associated "O" ring grooves 15. In the embodiment of the invention illustrated in FIG. 5, the cold cathode 22 is mounted to a cathode plate 21 which is in turn directly mounted to the vacuum chamber wall 11 by means of electrically insulating screws 34. Cathode plate 21 is preferably machined such that cold cathode 22 may be press fit, threaded, or otherwise mechanically attached thereto. The electrically insulating spacers 13 together with the insulating gap 51 insure electrical isolation of cold cathode 22 from vacuum chamber wall 11.

Cooling of the cold cathode 22 of FIGS. 2A-D and 3 is provided by employing a cooling cavity 43 internal to cold cathode 22 and an inlet 41 and outlet 42 that facilitates conventional circulation of a liquid or gas whose source is located outside vacuum chamber wall 11. External conductive cooling of the cold cathode 22 of FIGS. 4 and 5 is provided by employing a cooling attachment 60 that is attached to cold cathode 22 outside vacuum chamber wall 11. Cooling attachment 60 includes a coolant cavity 61 and inlet and outlet ports 62 and 63. Alternatively, cold cathode 22 may be cooled by means of a cooling attachment 60 that does not circulate a coolant but instead uses conventional radiator fins for air circulation and associated cooling.

It is noteworthy that, regardless of the cathode mounting technique illustrated in FIGS. 2-5, any of the illustrated embodiments of cold cathode 22 may be removable, may have internal or external cooling, and may have shaped front faces 23 for beam focusing and shaping.

We claim:

1. Apparatus for generating a glow discharge electron beam within a vacuum chamber, the apparatus comprising:

a cold cathode having a front face from which an electron beam is emitted, said cold cathode being positioned within an opening in a wall of the vacuum chamber such that the front face is directed inside the vacuum chamber and such that a gap is provided between the periphery of the cold cathode and the wall of the vacuum chamber surrounding the opening therein to electrically insulate the cold cathode from the wall of the vacuum chamber;

cathode fixture means mounted to the wall of the vacuum chamber and external to the vacuum chamber for retaining the cold cathode in a fixed position within the opening in the wall of the vacuum chamber;

first vacuum seal means positioned between the cold cathode and the cathode fixture means for providing a vacuum seal therebetween;

second vacuum seal means positioned between the cathode fixture means and the wall of the vacuum chamber for providing a vacuum seal therebetween; and a plurality of electrically insulating spacers selectively positioned within said gap to insure the uniformity of said gap along the periphery of the cold cathode;

said cold cathode having a cavity therein through which a coolant is circulated for cooling the cold cathode;

said first and second vacuum seal means comprising first and second "O" rings; and said cathode fixture means including first and second grooves for receiving said first and second "O" rings.

2. Apparatus for generating a glow discharge electron beam within a vacuum chamber the apparatus comprising:

a cold cathode having a front face from which an electron beam is emitted, said cold cathode being positioned within an opening in a wall of the vacuum chamber such that the front face is directed inside the vacuum chamber and such that a gap is provided between the periphery of the cold cathode and the wall of the vacuum chamber surrounding the opening therein to electrically insulate the cold cathode from the wall of the vacuum chamber;

cathode fixture means mounted to the wall of the vacuum chamber and external to the vacuum chamber for retaining the cold cathode in a fixed position within the opening in the wall of the vacuum chamber;

first vacuum seal means positioned between the cold cathode and the cathode fixture means for providing a vacuum seal therebetween;

second vacuum seal means positioned between the cathode fixture means and the wall of the vacuum chamber for providing a vacuum seal therebetween; and a plurality of electrically insulating spacers selectively positioned within said gap to insure the uniformity of said gap along the periphery of the cold cathode, said insulating spacers comprising insulating ball bearings;

said cold cathode having a cavity therein through which a coolant is circulated for cooling the cold cathode.

3. Apparatus for generating a glow discharge electron beam within a vacuum chamber, the apparatus comprising:

a cold cathode having a front face from which an electron beam is emitted, said cold cathode being positioned within an opening in a wall of the vacuum chamber such that the front face is directed inside the vacuum chamber and such that a gap is provided between the periphery of the cold cathode and the wall of the vacuum chamber surrounding the opening therein to electrically insulate the cold cathode from the wall of the vacuum chamber;

cathode fixture means mounted to the wall of the vacuum chamber and external to the vacuum chamber for retaining the cold cathode in a fixed position within the opening in the wall of the vacuum chamber;

first vacuum seal means positioned between the cold cathode and the electrically insulating spacer means for providing a vacuum seal therebetween;

second vacuum seal means positioned between the electrically insulating spacer means and the wall of the vacuum chamber for providing a vacuum seal therebetween; and electrically insulating spacer means selectively positioned between the cold cathode and the wall of the vacuum chamber to create said gap and to insure the uniformity of said gap along the periphery of the cold cathode;

said cold cathode having a cavity therein through which a coolant is circulated for cooling the cold cathode;

said first and second vacuum seal means comprising first and second "O" rings; and said electrically insulating spacer means includes first and second grooves for receiving said first and second "O" rings.

4. Apparatus for generating a glow discharge electron beam within a vacuum chamber, the apparatus comprising:

a cold cathode having a front face from which an electron beam is emitted, said cold cathode being positioned within an opening in a wall of the vacuum chamber such that the front face is directed inside the vacuum chamber and such that a gap is provided between the periphery of the cold cathode and the wall of the vacuum chamber surrounding the opening therein to electrically insulate the cold cathode from the wall of the vacuum chamber;

cathode fixture means mounted to the wall of the vacuum chamber and external to the vacuum chamber for retaining the cold cathode in a fixed position within the opening in the wall of the vacuum chamber;

vacuum seal means positioned between the cold cathode and the wall of the vacuum chamber for providing a vacuum seal therebetween;

electrically insulating spacer means selectively positioned within said gap to insure the uniformity of said gap along the periphery of the cold cathode; and cooling means mounted to the cold cathode external to the vacuum chamber for cooling the cold cathode;

said vacuum seal means comprising an "O" ring; and said wall of the vacuum chamber including a groove for receiving said "O" ring.

5. Apparatus for generating a glow discharge electron beam within a vacuum chamber, the apparatus comprising:

a cold cathode having a front face from which an electron beam is emitted, said cold cathode being positioned within an opening in a wall of the vacuum chamber such that the front face is directed inside the vacuum chamber and such that a gap is provided between the periphery of the cold cathode and the wall of the vacuum chamber surrounding the opening therein to electrically insulate the cold cathode from the wall of the vacuum chamber;

cathode plate means mounted to the wall of the vacuum chamber and external to the vacuum chamber for retaining the cold cathode in a fixed position within the opening in the wall of the vacuum chamber;

vacuum seal means positioned between the cathode plate means and the wall of the vacuum chamber for providing a vacuum seal therebetween;

electrically insulating spacer means selectively positioned within said gap to insure the uniformity of said gap along the periphery of the cold cathode; and cooling means mounted to the cathode plate means external to the vacuum chamber for cooling the cold cathode;

said vacuum seal means comprising an "O" ring; and said wall of the vacuum chamber including a groove for receiving said "O" ring.

* * * * *